(12) United States Patent
Gilson

(10) Patent No.: US 6,599,681 B2
(45) Date of Patent: Jul. 29, 2003

(54) ELECTROMAGNETIC FILTER FOR DISPLAY SCREENS

(75) Inventor: Jeffrey R. Gilson, Easton, MA (US)

(73) Assignee: Shielding Express, Taunton, MA (US)

(*) Notice: Subject to any disclaimer, the term of this patent is extended or adjusted under 35 U.S.C. 154(b) by 0 days.

(21) Appl. No.: 09/906,025

(22) Filed: Jul. 13, 2001

(65) Prior Publication Data

US 2003/0013048 A1 Jan. 16, 2003

(51) Int. Cl.[7] ................................................. H05K 9/00
(52) U.S. Cl. ........................ 430/321; 430/198; 430/319; 174/35 R; 174/35 MS
(58) Field of Search ................................. 430/321, 319, 430/198; 174/35 R, 35 MS

(56) References Cited

U.S. PATENT DOCUMENTS

| | | | |
|---|---|---|---|
| 5,017,419 A | 5/1991 | Smith | 428/209 |
| 5,032,490 A | 7/1991 | Nebe et al. | 430/281 |
| 5,049,480 A | 9/1991 | Nebe et al. | 430/281 |
| 5,084,132 A | 1/1992 | Smith | 156/659.1 |
| 5,373,102 A | 12/1994 | Ehrlich et al. | 174/35 R |
| 5,851,732 A | 12/1998 | Kanda et al. | 430/321 |
| 6,197,408 B1 | 3/2001 | Kanbara et al. | 428/209 |
| 6,214,527 B1 | 4/2001 | Kosaka et al. | 430/319 |
| 6,387,012 B1 * | 5/2002 | Mitamura | 477/553 |

FOREIGN PATENT DOCUMENTS

JP    11-278869    * 10/1999

OTHER PUBLICATIONS

Advanced Thick Film Materials for Flat Panel Displays, pp. 1–8, no date indicated.
Fodel®, Photoprintable Thick Film; Materials and Processing, pp. 1–7, no date indicated.
Fodel® DC206 Silver Conductor, pp. 1–2, May 25,2000 fax date.
Fodel® Advantage, *DuPont Microcircuit Materials*, pp. 1–14; no date indicated.

* cited by examiner

Primary Examiner—John A. McPherson
(74) Attorney, Agent, or Firm—Hamilton, Brook, Smith & Reynolds, P.C.

(57) ABSTRACT

A shielded substrate manufacturing technique is described which creates a conductive pattern on at least one transparent surface. The resulting product provides for both EMI shielding and visual transparency. It is formed by placing a thick film photo-printable composition on a substrate, exposing the thick film to a photo mask having a desired grid pattern, developing, and then firing the assembly. The process is less wasteful and more environmentally friendly than prior art processes that rely upon vapor deposition of metal in etching processes to provide the grid and provides a more uniformly spaced grid than techniques that use preconstructed metal wire meshes.

23 Claims, 4 Drawing Sheets

ELECTROMAGNETIC FILTER FOR DISPLAY SCREENS

BACKGROUND OF THE INVENTION

This invention relates generally to electromagnetic interference (EMI) radiation reduction and in particular to a technique for forming an EMI shield on a glass surface such as used in a Cathode-Ray Tube (CRT), Plasma Display Panel (PDP), Liquid Crystal Display (LCD), Electro-Luminescence (EL), or other display device.

With the increasing proliferation of various electronic appliances such as computer devices and the like, electromagnetic interference becomes a more common phenomenon. EMI is electromagnetic radiation that is emitted and/or received by an electronic device that adversely affects the performance of that device or other devices, or potentially causes harm to persons using the devices. The majority of EMI-related problems occur within a particular band of an electromagnetic spectrum known as the radio frequency (RF) range. Circuits in computers, telecommunication equipment, radios, televisions, medical devices, and numerous other electronic devices both emit RFI and are susceptible to RFI.

Normally, a so-called Faraday cage is provided by a conductive housing that surrounds an emitting or susceptible electronic device. The conductive barrier reflects or absorbs EMI energy and harmlessly carries it to a ground reference potential. In order to accomplish this effect, the housing is made of a conductive material, such as metal, or of a non-conductive material, such as plastic or plastic composite or ceramic, that has been metalized with a conductive coating.

Electronic display devices pose a challenge for EMI design. Testing by numerous private and government organizations, including the National Institute for Occupational Safety and Health (NIOSH) and the Food and Drug Administration's Bureau or Radiological Health (BRH) have so far failed to show any radiation hazard from the use of video display terminals. For example, the emissions of x-ray and radio frequency radiation have typically been found to be well below public exposure standards set for electronic equipment. Nonetheless, some researchers have suggested that chronic exposure to such radiation may be associated with certain types of health affects such as cancer.

In other applications, it is desirable to reduce EMI radiation from display screens in order to provide a more secure environment. For example, in sensitive industrial and/or military installations, it can be desirable to reduce the electromagnetic radiation from computer equipment in order to prevent eavesdropping activities. In addition, it is known that EMI emissions from display devices can affect the operation of adjacent unshielded electronic devices and may also be detected and read by highly sensitive eavesdropping equipment.

The challenge to provide shielding for a display is caused by the fact that it must include some type of window or other transparent surface. Metallic plates or metal coated plastics cannot therefore be directly used on the front surface of a display, because they would present an opaque material layer that blocks the view of the underlying display.

Various techniques do exist for providing both an electromagnetic shielding effect and visual transparency at the same time. These techniques include woven wire mesh, thin film compositions, and resins.

A woven wire mesh provides an electrically conductive grid or pattern located within or on a transparent base layer. There are several inherent disadvantages of wire mesh and its application to transparent base layers. One problem involves the inconsistency of the quality of the mesh weave. Wire separations, broken wires, and the linearity of the weave are potential problems. There is also, unfortunately, a lack of a variety of materials and configurations that may be used for the wire mesh itself. Mesh is typically available in limited increments such as fifty, eighty, and one hundred openings per inch (opi) and the wire base materials, for example, if chosen to be copper, are typically 0.0022 inches or more in diameter. But these limitations may present unacceptable constraints in certain applications. Such a thin wire mesh is typically flimsy and is difficult and time consuming to apply. The mesh may tend to tear, or otherwise become difficult to retain linearly and/or remain flat against the substrate. Wire meshes also typically present limitations on their overall physical size, especially if mesh, must be electroplated to improve conductivity. The maximum size of such meshes is typically expected to be 24 by 24 inches at the most.

Woven wire mesh being square or rectangular also inherently generate interference patterns on the display. These interference or Moire patterns result from the fact that the mesh and the underlying display pixels are superimposed upon one another. Consistency in the quality of the weave and lack of variety of materials and configurations also greatly contribute to the generation of interference patterns.

Also, electroplating may be applied to the mesh to improve its electro-conductivity or reduce light reflections. Unfortunately, plating can damage the mesh, resulting in inconsistency in the resulting weave. The plating process also adds thickness to the mesh material, resulting in reduced light transmission. However, providing insufficient thickness can result in insufficient electromagnetic shielding performance. Reflection-reducing coatings may be applied to improve visibility. However, these may result in color variation or stains within the completed window.

Another approach is to apply thin film materials to a transparent substrate. Processes such as vapor deposition and other thin film application techniques can be used. Unfortunately, this approach also has inherent disadvantages. First of all is cost. Depending upon the size and coating specified, a vapor deposited window can be ten times, or more, expensive than a wire mesh window. The cost is essentially driven by the high cost associated with vapor deposition equipment, which may require in excess of one million dollars or more to acquire.

Thin film techniques also have size limitations. Indeed, these probably are even more stringent in this regard than the wire mesh approach. Also, it is generally experienced that shielding levels are dramatically lower, typically one-third to one-half as good as the shielding provided by a wire mesh. The problem is that the thin film which exhibit very low resistance (which in turn means high shielding effectiveness) unfortunately typically result in low light transmission.

Yet another approach is to use electro-conductive resin materials. Such resins contain an embedded metallic powder or the like, and can be directly deposited on the transparent base layers. These techniques can be easily used with glass, polycarbonate, and other window materials because the conductive resins are compatible. However, transparency is typically not as good as either the thin film or the wire mesh approach. It is typically expected that shielding is even less effective as well, since the resin is not inherently conductive as a metal would be.

SUMMARY OF THE INVENTION

The present invention is a technique for forming an optically transparent electromagnetic shield. The method consists of layering a photo-printable, conductive composition onto an optically transparent substrate. The composition may be applied as a thick film paste in this step.

In a next step, a photo mask is applied over the photo-printable composition and exposed to collimated light. The photo mask may have a fine line width, such as 0.002 inches wide, to define a final grid pattern.

In a next step, a developer is applied to the substrate to remove the non-exposed photo sensitive material.

A final step of firing the substrate makes the remaining composition material conductive, thereby forming the desired conductive grid with the fine line spacing.

Thick film photo-printable compositions are available in a number of different materials and colors. These include various reflective metals such as gold, silver, copper, aluminum, nickel and/or combinations thereof, as well as black metals, or black pigmented materials. In a preferred embodiment, the composition may be a DuPont Fodel™ material.

It may be desirable to construct a multiple layer composition in a combination of initial steps such as forming, for example, a first conductive silver layer followed by a second, or outer, black layer. The second black layer provides for reduction in glare that might otherwise be caused by using only reflective materials.

The photo-printable composition may be applied to the glass substrate as an initial lamination. The steps of the process then proceed as in the case of applying the composition as a thick film paste.

Manufacturing a shielded window by using thick film photo-printable compositions according to the present invention provides a number of advantages.

First, precision high resolution patterning is possible with no resulting distortion. The invention, therefore, provides for a much more consistent quality pattern without risk of broken wires, linearity distortions, or electroplating inconsistencies.

The shield may be provided in an unlimited variety of patterns at essentially no additional cost. The window pattern can therefore be custom tailored for shielding effectiveness, light transmission, and elimination of interference patterns as particular applications may dictate. The only cost associated with changing the conductive pattern is the cost of the photo tool. This provides for great increase in the variety of resulting product configurations, greater control over the elimination of interference patterns on the display, and less cost than a wire mesh approach.

The process is easily adaptable for patterning large areas with high positive yields. Indeed, it can be used to shield displays of sixty inches in diagonal size.

Shielding effectiveness values remain comparable to that achievable with wire mesh. This is because the invention still implements a metal pattern, and does not rely upon conductive resins or other materials that are less effective for conducting electricity. While photo-lithography equipment typically needs to be acquired, the cost of this is in the tens of thousands of dollars as opposed to millions of dollars for thin film implementations.

Furthermore, the invention can be applied efficiently so that expensive materials such as the silver photo-printable composition can be applied efficiently. In particular, an initial course pattern can be silk screened that leaves large areas of the pattern open, with no composition applied. The photo masking step can then be used to provide an ultimately desired thin line widths.

Furthermore, by the additional use of black colored photo-printable compositions in conjunction with metal compositions in a subsequent step, display contrast can be greatly improved by decreasing reflection of external light from the resulting conductive pattern when it is viewed through the front plate of the display.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1A:
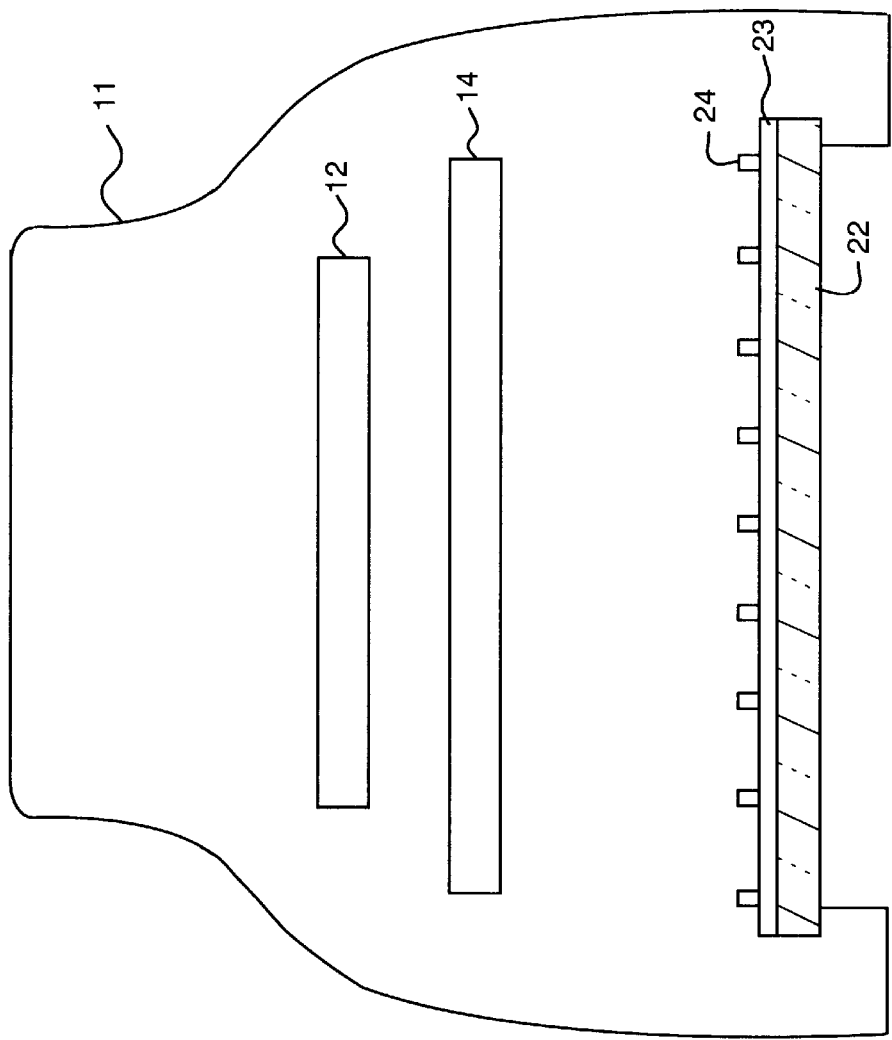
FIGS. 1A and 1B illustrate an optically transparent shielded article fabricated in accordance with the present invention.

FIG. 1A is a cross-sectional view of a display device 10 that may make use of a visually transparent electromagnetic shield according to the present invention. The display device 10 consists of a housing 11, driver electronics 12, display apparatus 14, and outer glass plate 22, and a conductive pattern formed on an interior portion of the outer glass plate 22.

As is typical, the housing is shaped to properly enclose the driver electronics 12 and other components. For example, the display apparatus 10 may be in the nature of a computer Cathode-Ray Tube (CRT) type display, in which case the housing has a familiar shape in the view of 1A, is taken from above. Display electronics 12 receive and transmit electrical signals to associated equipment that provide information to control the particular images presented on the display 10. The display device 14 itself consists of the display visual generating apparatus. For example, in the case of CRT display, this would include the CRT itself which causes pixels to be illuminated on the surface thereof. The housing 11, electronics 12, and display 14 are present in just about any display apparatus 10.

A transparent vapor deposited coating 23 may be placed on the inner surface of the glass 22 between the glass 22 and the ultimate conductive pattern 24. This transparent coating 23 may help with shielding if applied. The coating 23 may be tin oxide, indium tin oxide, or a thin silver layer. This permits the conductive pattern 24 to be opened up in dimension, thereby improving a light transmissive properties and reducing optical distortion.

It should be understood that the outer glass 22, which serves as a substrate for the pattern 24, may be provided as an integral portion of a manufactured display apparatus 10. However, it also may be provided on an original equipment manufacturer (OEM) basis to display venders, or as a retrofit or "after market" device that can be sold and adapted to existing displays.

In accordance with the invention, there is also placed on the inner surface of the outer glass plate 22 a shield or conductive pattern 24. The conductive pattern 24 serves to reduce electromagnetic interference (EMI) or other radiation to or from the display 10. The conductive pattern 24 is typically formed as a regular geometric pattern and may consist of squares, triangles such as right triangles, equilateral triangles or right angle triangles, rectangles such as squares, oblongs, parallelapipes, or trapezoids, polygons such hexagons, octagons, dodecagons, or isohedrons, circles, ellipsoids, star shapes, or any combination of these. Individual patterns may repeat by themselves or two or more of these patterns may be combined. An aperture ratio of the conductive pattern is designed to be at least 40% or more in view of the requirement to transmit visible light and is preferably at least 60% or more. The aperture ratio is defined as the percent ratio area of part of the unshielded surface compared to the total area of the glass substrate 22.

It will be understood shortly that the finished line width of the geometric conductive pattern 24 should typically be 0.002 inches or less, and the grid line spacing should be approximately from 0.1 to 0.005 inches.

Figure 1B:
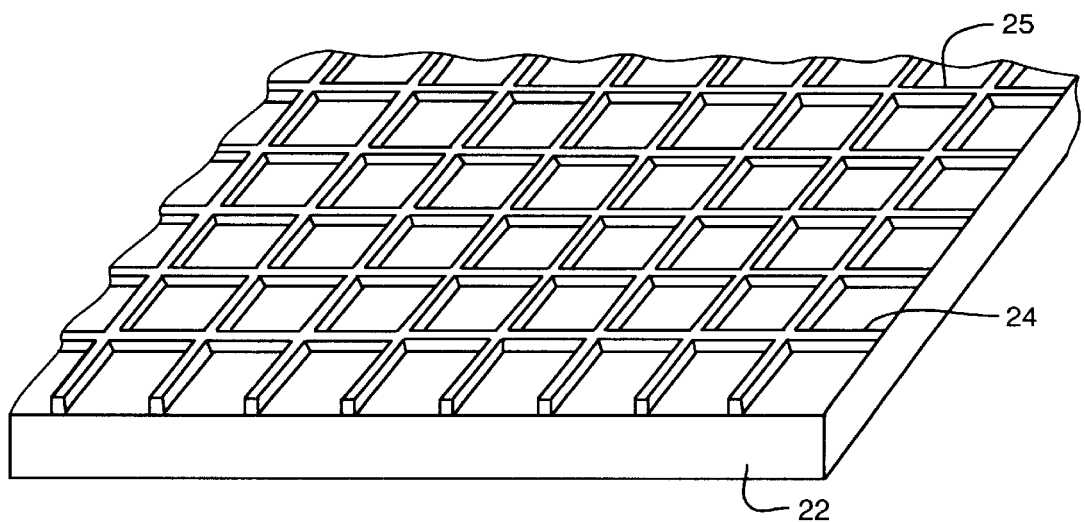

FIG. 1B shows a more detailed view of the conductive pattern 24 as formed on the substrate 22. While this illustration shows the pattern 24 as a rectangular grid, it should be understood that this in only one possible embodiment and that any of the patterns discussed above may be implemented.

It should be understood that the substrate material 22 is typically glass, but may be formed of one or more layers of some other transparent or translucent material such as rigid plastics, either thermoplastic or thermo-set plastics, including but not limited to polyacrylates and polycarbonates.

What is important that at least one surface of the substrate 22 contains conductive grid pattern 24 formed of interconnected electrically conductive elements 25. In this preferred example, the elements 25 are shown as squares; the elements 25 are also shown as being in contact with each of their surrounding element corresponding elements 25 so that electrical continuity is maintained throughout the pattern 24.

The size of the elements 25 depends in large part upon the shielding and visual opacity characteristics desired. The smaller the elements 25, the greater the shielding characteristics but the lesser the visual opacity and vice versa.

The display described herein is a cathode-ray tube (CRT). However, Liquid Crystal Displays (LCDs), Electro-Luminescence (EL) displays, and other display types may benefit from the process of the present invention directed to manufacturing the conductive pattern 24 on the substrate 22.

Turning attention now to FIGS. 2A through 2E, a first process for forming the grid 24 according to the present invention will be described in greater detail.

Figure 2A:
FIGS. 2A through 2E illustrate a sequence of steps in a process for making a conductive grid.

In a first step of the process shown in FIG. 2A, the glass substrate 22 is coated with a photo-printable thick film composition 30. The thick film photo-printable composition 30 maybe, for example, Fodel™ material available from DuPont Corporation. In this first step, the Fodel™ black type conductor such as DC243 may be used. The Fodel™ material is specially developed to be compatible with glass substrates and can be exposed and developed in accordance with standard techniques. Upon firing the Fodel™ material, it becomes conductive. But it should be understood that other photo-printable materials can be used as well.

Figure 2B:
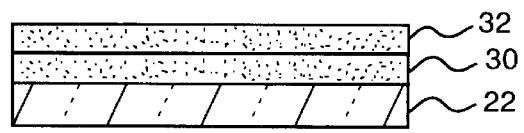

In any event, FIG. 2B is a potential intermediate step in which a second layer 32 of photo-printable composition may be applied. This second layer 32 may be a silver conductor such as Fodel™ DC206. By layering a silver composition 32 on top of the black composition 30, the end result will be a grid that is silver on one face and black on another face. The second layer of silver is added to lower the resistance of the conductive pattern which increases the EMI shielding performance.

As an alternative, a single layer can be used to provide both electrically conductive and black color properties such as those described in U.S. Pat. No. 6,214,527.

If desired, the composition layers 30 and 32 may be coated as a continuous thick film on the glass substrate 22; however, these may also be silk screened in a predetermined pattern. If employed, this first silk screening step may be to create a relatively coarse pattern with a relatively wider line width. For example, if a finished 0.005 width is desired, an initial 0.010 width pattern can be formed and then phototrimmed. Available silk screening techniques can provide lines in the range of from 0.010 through 0.100 inches.

Figure 2C:
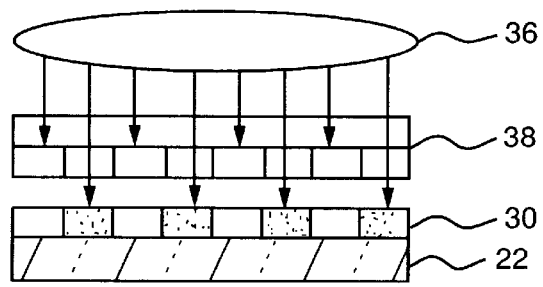

In the next step FIG. 2C, light is applied to the assembly to expose the composition. The collimated light source 36 is applied through a photo mask 38 having a desired detailed grid pattern 24. An appropriate photo lithography tool is a UV light source such as an HG or HG/XE light source at 365 nanometers. Recommended exposure energy ranges are from 300–700 microjewels per $cm^2$, and can correspond to 20–45 second exposure with high intensity (1 kilowatt) UV light sources.

Figure 2D:
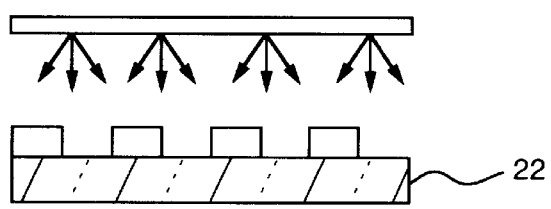

A development process in FIG. 2D is then carried out such as in a conveyorized spray development unit filled with an appropriate developer solution. One such solution is $NA_2CO_3$ of from 0.4 to 1% at 85° F. Total development time may depend upon equipment design, spray pressure, and thickness of the paste layers 30 or 32.

Figure 2E:
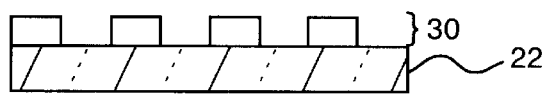

In a final step FIG. 2E, the conductive layer 30 and glass substrate 22 are fired in a furnace such as from 60–180 minutes at a peak temperature of from 540–600° C. The firing process converts the remaining composition layer 30 to a conductive state.

Alternatively, the substrate is used as a carrier, and the conductive pattern is transferred (removed) after formatting it. This permits the pattern 24 to be applied to materials such as plastic and the like.

Figure 3A:
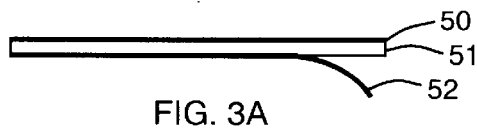
FIGS. 3A through 3G illustrate another sequence of steps in a different process according to the present invention.
Figure 3B:
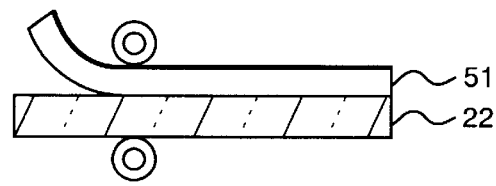

An alternate process resulting in the same manufactured article is shown in FIGS. 3A–3G. In this embodiment, the thick film photo-printable composition is provided as a thin transfer sheet 50 which is provided as a lamination. In a first step shown in FIG. 3A, a first protective cover film 52 is removed from the lamination and applied. In FIG. 3B, the tape product is applied such as with a rolled lamination to the glass substrate 22.

Figure 3C:
Figure 3D:
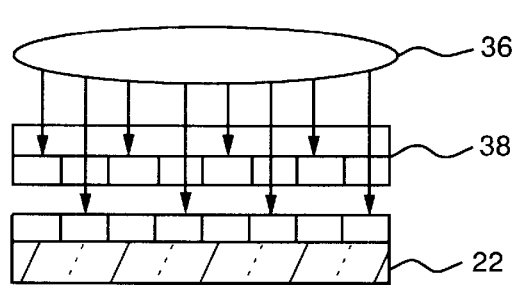

In a next step FIG. 3C, a base film 50 is removed from the composition 51. The remaining steps of the process FIGS. 3D, 3F, and 3G proceed as in corresponding steps 2C, 2D, and 2F where the photo mask 38 and collimated UV light 36 are applied. The firing step of FIG. 3G then sets the material in its final metallicized state.

Figure 3E:
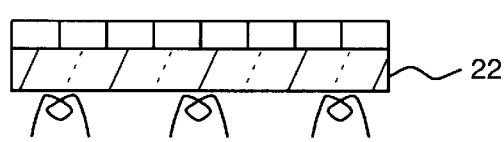
Figure 3F:
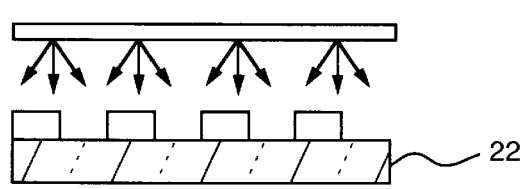
Figure 3G:
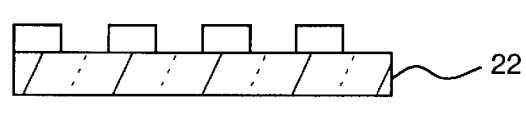

In additional intervening step FIG. 3E may be applied in use of the tape material which is a post-exposure bake process. This can further be used to adhere the composition material to the glass substrate 22.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for making a visually transparent radio frequency interference shield comprising the steps of:
   providing a photo-sensitive, thick film composition on a substrate;
   exposing the photo-sensitive composition to photo radiation to define a pattern of interconnected elements forming a grid of crossed and electrically connected conductive lines in two dimensions for the radio frequency interference shield;
   developing the exposed photo-sensitive composition in solution to remove the thick film material in areas not exposed to photo radiation; and
   firing the developed thick film composition, thereby forming an enhanced conductivity thick film on the optically transparent substrate.

2. A method as in claim 1 wherein the substrate is formed of a material selected from a group consisting of glass, transparent plastic, or other transparent material.

3. A method as in claim 1 wherein photo-printable composition is a conductive thick film paste.

4. A method as in claim 1 wherein the photo-printable composition is printed onto the substrate in the approximate desired grid pattern.

5. A method as in claim 1 wherein the photo-printable composition is fabricated as a film which is roll-laminated onto the substrate.

6. A method as in claim 1 additionally comprising the step of:
   transferring the completed electromagnetic shield onto another carrier material.

7. A method as in claim 1 wherein the grid pattern has an open area of at least 40%.

8. A method as in claim 1 wherein the substrate material is a conductive glass.

9. A method as in claim 8 wherein the substrate material comprise an additional conductive thin film layer.

10. A method as in claim 1 additionally comprising the step of laminating:
    a second glass layer onto a first glass layer.

11. A method as in claim 1 additionally comprising the step of:
    coating a second opaque non-reflective thick film on the developed and fired thick film conductive composition to improve display contrast by decreasing reflections from external light.

12. A method as in claim 11 wherein the second layer is a conductive layer.

13. A method as in claim 11 wherein the second layer is a non-conductive layer.

14. A method as in claim 1 wherein the composition is a conductive black material.

15. A method as in claim 1 additionally comprising the step of after the firing step:
    blackening the photo-printable conductive composition.

16. A method as in claim 15 wherein the step of blackening the composition is one of chemically treating or electroplating.

17. A method as in claim 1 wherein the width of the conductive trace is about 0.003 inches or less.

18. A high definition conductive pattern used for electromagnetic interference shielding of an optical window, wherein a photo-sensitive conductive thick film composition defines a conductive pattern of interconnected elements as a grid of crossed and electrically connected conductive lines in two dimensions.

19. An apparatus as in claim 18 wherein the conductive pattern is formed on a visually transparent substrate.

20. An apparatus as in claim 19 wherein the visually transparent substrate is of a material selected from a group consisting of glass, plastic, or other transparent material.

21. An apparatus as in claim 18 additionally comprising:
    a second, non-reflective composition coated onto the photosensitive conductive composition to improve display contrast by decreasing reflections from external light.

22. An apparatus as in claim 21 wherein the second composition layer is conductive.

23. An apparatus as in claim 21 where the second composition is nonconductive.

* * * * *